United States Patent [19]

Ritt

[11] 4,401,508

[45] Aug. 30, 1983

[54] METHOD FOR REMOVING INSOLUBILIZED PVA FROM THE SURFACE OF A BODY

[75] Inventor: Peter M. Ritt, Lancaster, Pa.

[73] Assignee: RCA Corporation, New York, N.Y.

[21] Appl. No.: 436,946

[22] Filed: Oct. 27, 1982

[51] Int. Cl.³ .......................... C23F 1/02; B44C 1/22; C03C 15/00; C03C 25/06
[52] U.S. Cl. .................................. 156/659.1; 134/42; 156/661.1; 156/668; 156/904; 156/644; 430/23; 430/323; 430/329
[58] Field of Search ..................... 156/644, 659.1, 668, 156/904, 661.1; 430/23, 313, 316, 318, 323, 329; 134/42; 427/43.1; 252/79.2

[56] References Cited

U.S. PATENT DOCUMENTS

| | | | |
|---|---|---|---|
| 3,175,907 | 3/1965 | Fishman | 96/36 |
| 3,415,648 | 12/1968 | Certa | 96/36 |
| 3,796,603 | 3/1974 | Cox et al. | 134/42 |
| 4,208,242 | 6/1980 | Zampiello | 156/659.1 |
| 4,339,528 | 7/1982 | Goldman | 430/323 |
| 4,339,529 | 7/1982 | Goldman | 430/323 |

Primary Examiner—William A. Powell
Attorney, Agent, or Firm—E. M. Whitacre; D. H. Irlbeck; L. Greenspan

[57] ABSTRACT

In a method for removing insolubilized polyvinyl alcohol portions from the surface of a body on which it is adhered, the step of contacting said stencil and surface with an aqueous stripping solution containing at least one nonoxidizing mineral acid, such as hydrochloric acid and phosphoric acid, in concentration that is effective to remove said portions with at most light mechanical action.

10 Claims, 5 Drawing Figures

METHOD FOR REMOVING INSOLUBILIZED PVA FROM THE SURFACE OF A BODY

BACKGROUND OF THE INVENTION

This invention relates to a novel method for removing insolubilized PVA (polyvinyl alcohol-acetate) portions from the surface of a body and particularly, but not exclusively, to a method for stripping an etch-resistant PVA stencil from a metal body after the body has been etched.

The preparation of apertured masks for use in cathode-ray tubes by photoexposure and etching has been described previously, for example, in U.S. Pat. No. 4,061,529 issued Dec. 6, 1977 to A. Goldman et al. In a typical process, light-sensitive coatings of sensitized natural protein materials are applied to both major surfaces of a thin metal sheet, such as a sheet of a cold-rolled steel or of a copper-nickel alloy. The coatings are exposed to light images, as by contact printing exposure, to harden (render less soluble) the exposed portions of the coatings in an aqueous solvent. The exposed coatings are developed by removing only the more-soluble portions of the coatings, thereby producing a stencil on each surface of the sheet. Then, the stencils are baked to make them more resistant to an etchant for the metal sheet. Usually the etchant is an aqueous solution of ferric chloride and hydrochloric acid. Then, the sheets with the stencils thereon are selectively etched as desired, after which the stencils are removed from the sheet. In present commercial practice, the light-sensitive coatings are dichromate-sensitized casein; such as the coatings disclosed in the above-cited Goldman et al. patent. Etch resistance is developed by baking the coatings in air at about 200° C. to 350° C. After etching the metal sheet with a ferric chloride-hydrochloric acid solution, the stencils are removed by applying thereto a hot aqueous solution of sodium hydroxide or other alkali.

It is desirable for several reasons to provide alternative light-sensitive coatings, particularly light-sensitive synthetic materials, in place of the light-sensitized natural materials that are presently used. The use of acid-resistant stencils of insolubilized dichromate-sensitized PVA has been suggested in the prior art. However, the prior art has recognized that it is difficult to completely remove the stencils in an industrial and cost-effective manner with alkali solutions. U.S. Pat. No. 4,208,242 issued June 17, 1980 to P. Zampiello suggests using films of dichromate-sensitized polyvinyl alcohol-acetate as the light-sensitized coating for making apertured masks in steel sheets. The PVA employed in this film is 98.5% to 100% hydrolyzed and has a molecular weight of about 14,000. The film, after developing, is baked at about 250° C. for about 2 to 3 minutes to improve the acid resistance thereof. This produces very adherent stencils which require a special treatment to remove them. That treatment requires, after etching the sheet, baking the stencils at about 250° to 300° C. until the stencils are carmelized. Then, the carmelized stencils can be removed with hot aqueous alkali sodium hydroxide solutions.

U.S. Pat. No. 4,339,528 to A. Goldman suggests avoiding the post-etch baking step employed in the Zampiello method by using a PVA selected from a small group defined by degree of hydrolysis and molecular weight. U.S. Pat. No. 4,339,529 to A. Goldman suggests avoiding the post-etch baking employed in the Zampiello process by adding NMA (N-methylol acrylamide) to the resist composition. In both of these patents, the acid-resistant stencils are stripped off with a hot aqueous alkali solution.

In other applications which use insolubilized PVA stencils for etching, the stencil is removed using chemicals that are chemically oxidizing to insolubilized PVA chemicals. As examples, U.S. Pat. No. 3,175,907 to A. Fishman discloses treating the stencil with a hot aqueous solution of a peroxide or a perborate; U.S. Pat. No. 3,415,648 to A. J. Certa discloses treating the stencil with hot aqueous chromic acid; and U.S. Pat. No. 3,796,603 to Cox et al. discloses treating the stencil with an aqueous solution of a permanganate or a periodate. In the Cox et al. patent, the periodate may be periodic acid.

Each of these prior methods for removing insolubilized PVA portions from the surface of a body has at least one of the following disadvantages: (1) it is too slow, (2) PVA removal is incomplete, (3) it is too costly and/or (4) it is not well adapted to be implemented by machine. The novel method is relatively fast, the removal is complete, it is cost effective and it can be implemented by machine.

SUMMARY OF THE INVENTION

In the novel method for removing the insolubilized PVA portions from the surface of a body to which it is adhered, the PVA portions and the surface are contacted with an aqueous stripping solution containing at least one nonoxidizing mineral acid, such as hydrochloric acid and/or phosphoric acid, in concentration that is effective to remove said PVA portions with at most light mechanical action. The stripping solution employed in the novel method is neither alkali nor chemically oxidizing to hardened, insolubilized PVA.

For etching apertured masks or the like in a steel sheet, the novel method follows the prior methods including the use of stencils of dichromate-sensitized PVA which have been insolubilized with ultraviolet light and then with heat. The steel sheet is etched with a ferric chloride etching solution containing less than about 0.06 N hydrochloric acid, which does not attack the stencil during the etching step. After etching is completed, the stencil is removed using the above-mentioned nonoxidizing acid-stripping solution. It may be desirable to assist the removal by light mechanical action, such as by impinging hydraulic jets, or by a light brushing of the stencils from the metal body.

DETAILED DESCRIPTION OF THE PREFERRED EMBODIMENT

The invention is described below as part of a wet chemical etching process for fabricating apertured masks for use in color television picture tubes. However, the novel step of removing or stripping hardened PVA stencils from the surface of a body can be used as part of another process which involves another type of etching, or which does not involve etching of the body at all.

Figure 1:
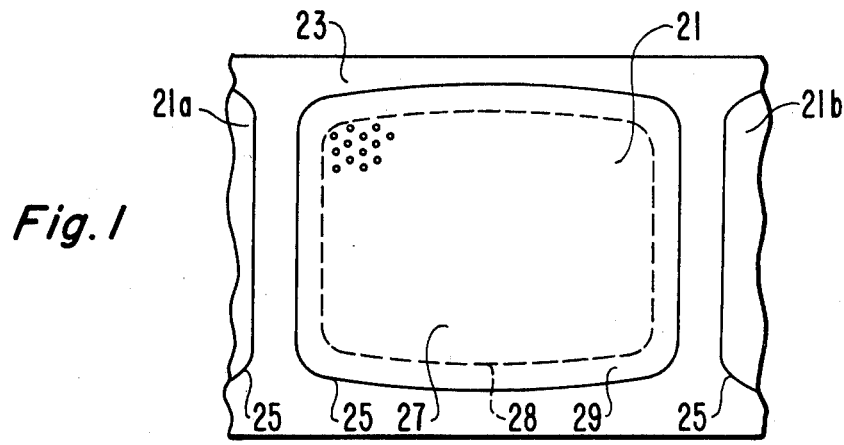
FIG. 1 is a plan view of a metal sheet after etching has been completed and the etch-resistant stencils have been stripped from the sheet according to the novel method.

FIG. 1 shows a plan view of an etched apertured mask blank 21 stripped of its etch-resistant stencils as it emerges from an etching machine. The mask blank 21 (which is to be used in a color television picture tube) is in a metal sheet 23 comprising a succession of such mask blanks 21a, 21 and 21b which are etched through at the margins 25 thereof except at convenient points (not indicated) sufficient to hold the mask blank in place in the sheet 23. The mask blank 21 is comprised of an apertured central portion 27 defined by the broken line 28, and a skirt or peripheral portion 29 which is nt apertured, although in some embodiments it may be etched partly through. The apertures may be round and arranged in a hexagonal, diamond-shaped or other array. Or, the apertures may be rectangular slits arranged in vertical rows; for example 6-mil by 30-mil slits on 30-mil centers. The apertures may be of other shapes and arrangements. In any of the embodiments, the aperture width may be uniform across the mask or may be graded in width or diameter from the center to the edge of the array as is known in the art.

The mask blank 21 is etched into a regular-carbon or a low-carbon cold-rolled-steel sheet about 4 to 10 mils in thickness. The etching also may be conducted in sheets of other materials, such as invar alloy, or copper-nickel alloy. The sheet 23 is passed through the various operations including cleaning the sheet, producing etch-resistant stencils on the sheet, etching the sheet to produce the apertures and to define the mask blanks, and then stripping (removing) the stencils from the sheet. Subsequently, the mask blanks 21 are separated from the sheet 23. The mask blanks 21 are then heat treated (annealed), roller leveled, formed on a press, and then blackened as is known in the art, to produce masks suitable for assembly into a color-television picture tube.

Figure 2:
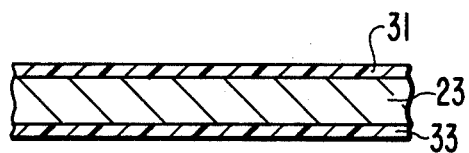
FIGS. 2 through 5 are sectional views through one aperture location of the metal sheet illustrating the steps of one embodiment of the novel method.
Figure 3:
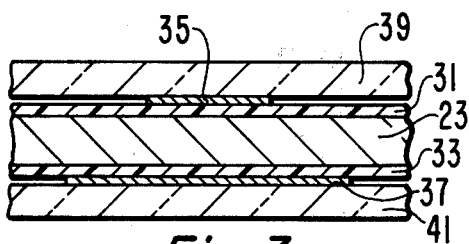

FIGS. 2 through 5 illustrate one embodiment of the novel method by a sequence of steps that may be used in making an aperture in the central postion 27 of a hexagonal array of apertures in a 6-mil-thick strip of low-carbon cold-rolled steel, as shown in FIG. 1. The sheet 23 is coated on both major surfaces with one of the known liquid coating compositions containing PVA and a dichromate sensitizer therefor, and used for this purpose. The coatings are dried in air, producing light-sensitive coatings 31 and 33 of dichromate-sensitized PVA, as shown in FIG. 2. After the coatings have dried, the coated strip is positioned in a chase between two light-opaque master patterns; one master pattern 35 for the coating 31 on the one major surface of the sheet 23; and the other master pattern 37 for the other coating 33 on the other major surface of the sheet 23, as shown in FIG. 3. The light-opaque patterns physically contact the coatings 31 and 33. The one master pattern 35 has a circular shape about 5 mils in outside diameter. The other master pattern 37 has a circular shape about 16 mils in diameter. Center lines of the one and the other master patterns are coincident, but may be offset from one another if desired.

With the patterns 35 and 37 positioned as shown in FIG. 3, the coatings 31 and 33 on each of the surfaces of the sheet 23 are now exposed to actinic (hardening) radiation, as from a carbon-arc soruce, or xenon radiation lamp, which radiation passes through the glass plates 39 and 41 incident on the coatings 31 and 33 except where the one and the other master patterns 35 and 37 shadow the coatings. When the coatings are suitably exposed, the exposure is stopped, and the master patterns are removed.

Figure 4:
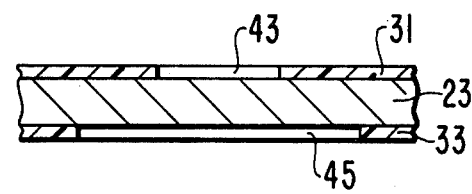

The coatings 31 and 33 are now developed as by flushing with water or other aqueous solvent to remove the unexposed, more-soluble, shadowed portions of the coatings 31 and 33. As shown in FIG. 4, after development, the sheet 23 carries on its one major surface a first stencil comprising a coating 31 having a first circular opening 43 therein and, on its other major surface, a second stencil comprising a coating 33 having a second circular opening 45 therein. The stencil coatings 31 and 33 with the openings 43 and 45 therein are now baked in air at about 250° C. to 275° C. in this embodiment to develop better etch-resistance in the coatings.

Figure 5:
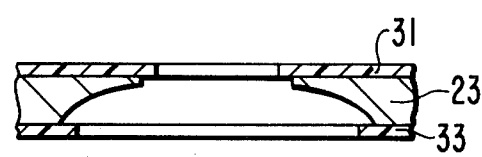

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric chloride-hydrochloric acid liquid etchant. Controlled amounts of chlorine gas are fed into the etchant to maintain its etching strength. Most of the etching is done by the ferric chloride and little by the hydrochloric acid. It is only necessary to maintain the pH of the etchant in a desired range with hydrochloric acid concentrations of less than about 0.06 N. Such low concentrations of hydrochloric acid have little or no effect on the PVA stencil. Ferric chloride in any concentration has little or no effect on the PVA stencil.

After the etching has been completed, the coated sheet 23 is washed with water to remove any residual etchant. Then, the etch-resistant stencils 31 and 33 are removed from the sheet 23, as by sloshing the sheet in an aqueous solution containing about 0.1 to 0.3 N hydrochloric acid maintained at temperature in the range of about 25° C. to 75° C. for about 3 to 5 minutes, whereby the stencils are lifted off the sheet in large pieces. After removing the stencils, the sheet 23 is washed in water and dried producing the product shown in FIG. 1.

In the coating composition used for making the stencil described above, several factors are important:

1. Any PVA that is 85% to 98% hydrolyzed and has a molecular weight of about 10,000 to 150,000 may be used. These are synthetic polymeric materials that are available under various trade names. A stencil made of a PVA with a higher percent hydrolysis requires a higher baking temperature prior to etching. Higher molecular weights for the PVA do not compensate for the disadvantages that result from the higher percentage of hydrolysis.

2. Among sodium, potassium and ammonium dichromate photosensitizers for the PVA, sodium dichromate is the preferred alkali dichromate because it imparts longer shelf life to the coatings. The photosensitizer comprises about 0.03 (3%) to 0.08 (8%) of the weight of the PVA present and determines the pH of the coating composition. Coatings containing less than 3% dichromate require too long an exposure to be practical. Coatings containing more than 8% dichromate exhibit such short shelf life as to be impractical for factory use. The photoexposure times required by the coating are equivalent to those used for other dichromate-sensitized PVA coatings. Exposure times of about 15 to 45 seconds are typical using a pulsed 8-watt xenon lamp about 29 inches away from the coating.

3. No other additive is required in the coating composition. No surfactant is used in the coating composition because its presence reduces the adherence of the photoexposed coating of the baked stencils. No borax or other alkalizing material is used in the coating compositions because it gels the composition and generally makes it difficult to coat the composition on the surface of the body.

4. Coating thicknesses on the metal sheet are important parameters in the novel method. If the coating is too thin, under about 60 micro inches, the etching will be nonuniform and cause mask defects. If the coating is too thick, over about 120 micro inches, the coating will require longer exposure times and there may be mechanical pump-down problems and poor mask uniformity.

5. The preferred pre-etch baking temperature for enhancing etch resistance to a developed PVA coating is in the range of about 200° to 300° C. for about 90 to 300 seconds. The lower baking temperatures are used in combination with longer baking times. PVA coatings baked at these temperatures are most efficiently removed by the acid treatment after the etching step is completed. Generally, the higher the temperature of the etchant used, the higher should be the pre-etch baking temperature for the developed coating.

6. After the etching step is completed, hardened stencils are removed from the metal sheet according to the novel method by contacting the sheet and stencil with a dilute aqueous solution containing effective concentrations of a strong, nonoxidizing acid, such as hydrochloric and/or phosphoric acid. Hydrochloric acid in concentration of about 0.1 to 0.3 N is preferred. Phosphoric acid in concentrations of about 0.5 to 2.5 N may be used instead of, or along with, hydrochloric acid. These acids are believed to attack the interface between the stencil and the surface to which the stencil is adhered. This is evidenced by the observation that the stencil is released from the surface in large pieces. A light brushing of the stencil after treatment with the stripping solution permits the removal of the stencil in about 1 to 5 minutes. Without brushing, but using a spray of the stripping solution, 3 to 10 minutes may be required to remove these stencils. The selection of temperature, concentration and time of application of the stripping solution may be optimized by a relatively few trails by persons of ordinary skill in the art.

What is claimed is:

1. In a method for removing insolubilized polyvinyl alcohol portions from the surface of a body on which it is adhered, the step of contacting said stencil and surface with an aqueous stripping solution containing at least one nonoxidizing mineral acid in concentration that is effective to remove said portions with at most light mechanical action.

2. The method defined in claim 1 wherein said mineral acid is selected from the group consisting of hydrochloric acid and phosphoric acid.

3. The method defined in claim 1 wherein said solution contains hydrochloric acid in the range of about 0.1 to 0.3 N.

4. The method defined in claim 1 wherein said solution contains phosphoric acid in the range of about 0.5 to 2.5 N.

5. The method defined in claim 1 wherein said portions have been insolubilized both photochemically and thermally.

6. In a method for etching a metal body including the steps of:
   (a) producing on a surface of said body an etch-resistant stencil consisting essentially of insolubilized dichromate-sensitized polyvinyl alcohol,
   (b) etching said body by contacting said stencil-bearing surface with an aqueous etching solution of ferric chloride and hydrochloric acid, said hydrochloric acid being present in concentration that is ineffective to remove said stencil from said body,
   (c) and then removing said stencil from said body,
   the improvment which consists in removing said stencil at step (c) by contacting said stencil and surface with an aqueous stripping solution containing at least one mineral acid selected from the group consisting of hydrochloric acid and phosphoric acid, said at least one acid being present in a concentration that is effective to remove said stencil from said body.

7. The method defined in claim 6 wherein said polyvinyl alcohol of said stencil is insolubilized by exposure to ultraviolet light and then by heating in air at temperature above about 200°.

8. The method defined in claim 7 wherein said etching solution contains hydrochloric acid in a concentration of less than about 0.06 N.

9. The method defined in claim 8 wherein said stripping solution contains hydrochloric acid in a concentration of at least about 0.1 N.

10. The method for etching a metal body defined in claim 6 including the steps of
   (i) coating a surface of a steel body with a film of a photoresist consisting essentially of polyvinyl alcohol and a dichromate sensitizer therefor,
   (ii) exposing said film to a pattern of actinic radiation whereby exposed portions of said film are insolubilized,
   (iii) developing said film by dissolving unexposed portions thereof while retaining exposed portions thereof in situ, thereby producing a stencil on said surface,
   (iv) heating said developed film to temperatures of about 250° to 300° C. whereby said retained exposed portions of said film are further insolubilized,
   (v) then etching said body with an aqueous solution of ferric chloride containing hydrochloric acid in a concentration of less than about 0.06 N and
   (vi) then removing said film portions from said body by applying thereto an aqueous solution containing hydrochloric acid in a concentration in the range about 0.1 to 0.3 N.

* * * * *